United States Patent [19]
Crotzer et al.

[11] Patent Number: 5,949,029
[45] Date of Patent: Sep. 7, 1999

[54] CONDUCTIVE ELASTOMERS AND METHODS FOR FABRICATING THE SAME

[75] Inventors: David R. Crotzer, Nashua, N.H.; Jonathan W. Goodwin, Braintree, Mass.; Arthur G. Michaud, New Bedford, Mass.; David A. DeDonato, Hopedale, Mass.

[73] Assignee: Thomas & Betts International, Inc., Sparks, Nev.

[21] Appl. No.: 08/736,830

[22] Filed: Oct. 28, 1996

Related U.S. Application Data

[63] Continuation-in-part of application No. 08/294,370, Aug. 23, 1994, Pat. No. 5,599,193, and application No. 08/348,574, Dec. 2, 1994, Pat. No. 5,600,099.

[51] Int. Cl.[6] .................................................. H05K 1/00
[52] U.S. Cl. ............................ 174/254; 174/256; 428/323
[58] Field of Search ..................................... 428/209, 901, 428/323; 174/254, 256, 250

[56] References Cited

U.S. PATENT DOCUMENTS

| | | |
|---|---|---|
| 3,100,933 | 8/1963 | Hancock et al. . |
| 3,203,083 | 8/1965 | Obenhaus . |
| 3,482,726 | 12/1969 | Schroeder, Jr. . |
| 3,555,664 | 1/1971 | Bingham et al. . |
| 3,632,319 | 1/1972 | Hoppin et al. ............................. 29/487 |
| 3,698,931 | 10/1972 | Horowitz ............................... 117/47 R |
| 3,700,427 | 10/1972 | Hoppin, III et al. ...................... 75/5 R |
| 3,818,415 | 6/1974 | Evans et al. ............................ 339/17 F |
| 3,880,580 | 4/1975 | Horowitz et al. .............................. 8/4 |
| 3,921,885 | 11/1975 | Knox ........................................ 228/116 |
| 3,929,800 | 12/1975 | Horowitz ............................. 260/290 R |
| 3,940,377 | 2/1976 | Horowitz et al. ............... 260/79.5 NV |
| 4,105,811 | 8/1978 | Horowitz et al. ........................ 427/302 |
| 4,106,955 | 8/1978 | Horwitz et al. .............................. 148/6 |
| 4,157,932 | 6/1979 | Hirata ...................................... 156/310 |
| 4,288,081 | 9/1981 | Sado ........................................... 277/1 |

(List continued on next page.)

OTHER PUBLICATIONS

Electronics Review—Packing—Elastic conductors aid watch packaging, *Electronics*, Jan. 24, 1974, pp. 32–33.
Leonard S. Buchoff, Conductive elastomers make small, flexible contacts, *Electronics*, Sep. 19, 1974.
Role of conductive elastomers expands to p–c boards and connector designs, *Electronics*, Oct. 31, 1974.
Conductive elastomers make bid to take over interconnections, *Product Engineering*, Dec. 1974, vol. 45, No. 12, pp. 43–45.
Jordan Backler, Gold–Plated Headaches, connector symposium spotlights materials shortages, shrinking designs & unisex connectors., *ElectroMechanical Design*, Dec. 1974, pp. 19, 20, 22, & 24.
Leonard S. Buchoff, Ph.D., Conductive Rubber in Connectors, *ANTEC*, '84, pp. 696–698.
Dr. Leonard S. Buchoff, Elastomeric Connectors For Land Grid Array Packages, *Connection Technology*, Apr. 1989.

Primary Examiner—Hyung Sub Sough
Assistant Examiner—William Silverio
Attorney, Agent, or Firm—Weingarten, Schurgin, Gagnebin & Hayes LLP

[57] ABSTRACT

Several different types of electrically conductive elastomers are disclosed along with the methods for their fabrication. In one particular embodiment, a layered composition is disclosed which comprises a substrate, a first layer, and a second layer. The substrate is formed of a non-conductive elastic material and it has an outer surface. The first layer, which is formed with a non-conductive elastic material, is grafted to the outer surface of the substrate. The second layer, which is formed with a non-conductive elastic material having a quantity of conductive flakes interspersed therein, is grafted to an outer surface of the first layer. The second layer can further be formed with a quantity of rounded or jagged conductive particles interspersed in the non-conductive elastic material such that some of the conductive particles are present along an outer surface of the second layer. Alternatively, a quantity of rounded or jagged conductive particles may be imbedded in an outer surface of the second layer.

5 Claims, 6 Drawing Sheets

U.S. PATENT DOCUMENTS

| | | | |
|---|---|---|---|
| 4,563,725 | 1/1986 | Kirby | 361/388 |
| 4,593,961 | 6/1986 | Cosmo | 339/61 M |
| 4,606,778 | 8/1986 | Jahnke | 148/11.5 N |
| 4,659,872 | 4/1987 | Dery et al. | 174/117 A |
| 4,666,226 | 5/1987 | Legrand et al. | 339/61 M |
| 4,688,150 | 8/1987 | Peterson | 361/403 |
| 4,698,275 | 10/1987 | Holt | 428/40 |
| 4,731,282 | 3/1988 | Tsukagoshi et al. | 428/220 |
| 4,737,112 | 4/1988 | Jin et al. | 439/66 |
| 4,754,546 | 7/1988 | Lee et al. | 29/877 |
| 4,758,927 | 7/1988 | Berg | 361/401 |
| 4,778,950 | 10/1988 | Lee et al. | 174/356 C |
| 4,804,132 | 2/1989 | DiFrancesco | 228/115 |
| 4,814,040 | 3/1989 | Ozawa | 156/634 |
| 4,847,136 | 7/1989 | Lo | 428/195 |
| 4,847,146 | 7/1989 | Yeh et al. | 428/332 |
| 4,894,706 | 1/1990 | Sato et al. | 357/72 |
| 4,939,568 | 7/1990 | Kato et al. | 357/75 |
| 4,954,875 | 9/1990 | Clements | 357/75 |
| 4,963,425 | 10/1990 | Buchanan et al. | 428/212 |
| 5,065,282 | 11/1991 | Polonio | 361/399 |
| 5,083,697 | 1/1992 | Difrancesco | 228/116 |
| 5,092,774 | 3/1992 | Milan | 439/66 |
| 5,106,308 | 4/1992 | Gollomp et al. | 439/67 |
| 5,118,299 | 6/1992 | Burns et al. | 439/74 |
| 5,148,266 | 9/1992 | Khandros et al. | 357/80 |
| 5,173,766 | 12/1992 | Long et al. | 257/687 |
| 5,175,409 | 12/1992 | Kent | 219/85.22 |
| 5,175,491 | 12/1992 | Ewers | 324/158 F |
| 5,220,726 | 6/1993 | Mantell | 29/885 |
| 5,237,203 | 8/1993 | Massaron | 257/688 |
| 5,267,867 | 12/1993 | Agahdel et al. | 439/73 |
| 5,270,571 | 12/1993 | Parks et al. | 257/686 |
| 5,273,440 | 12/1993 | Ashman et al. | 439/71 |
| 5,281,852 | 1/1994 | Normington | 257/685 |
| 5,288,238 | 2/1994 | Ikenaka et al. | 439/91 |
| 5,306,558 | 4/1994 | Takahashi et al. | 428/331 |
| 5,340,640 | 8/1994 | Bientz | 428/206 |
| 5,371,327 | 12/1994 | Fujinami et al. | 174/257 |
| 5,536,568 | 7/1996 | Teruo | 428/327 |
| 5,670,251 | 9/1997 | Difrancesco | 428/325 |

CONDUCTIVE ELASTOMERS AND METHODS FOR FABRICATING THE SAME

CROSS-REFERENCE TO RELATED APPLICATIONS

This patent application is a continuation-in-part patent application of U.S. patent application Ser. No. 08/294,370 filed Aug. 23, 1994, now U.S. Pat. No. 5,599,193 and U.S. patent application Ser. No. 08/348,574 filed Dec. 2, 1994.

FIELD OF INVENTION

The present invention relates generally to electrically conductive devices and, more particularly, to electrically conductive elastomers and methods for fabricating the same.

BACKGROUND OF THE INVENTION

The evolution of integrated circuits has been to decrease the package size of an integrated circuit while increasing the number of electrical leads for electrical interconnection between the integrated circuit and a circuit board on which it resides. As the number of electrical leads per integrated circuit has increased, the electrical leads have become smaller in size and more closely spaced, thereby increasing the difficulty in mounting an integrated circuit to a circuit board.

One method of overcoming this difficulty has been to replace the electrical leads, which are located around the perimeter of an integrated circuit package, with electrical contacts, which are located on the bottom surface of an integrated circuit package, thereby forming a leadless integrated circuit package. These electrical contacts typically have the shape of small protuberances or "balls" which are spaced in a grid array pattern. An integrated circuit package having these bottom surface electrical contacts is placed within a leadless integrated circuit socket or mounting device which retains the integrated circuit package. The mounting device has mating electrical contacts spaced in a grid array pattern which align with the electrical contacts on the integrated circuit package so as to provide electrical continuity between the integrated circuit package and a circuit board upon which the mounting device resides.

One problem that arises with leadless integrated circuit packages is that the electrical contacts of a leadless integrated circuit package and the mating electrical contacts of a mounting device become oxidized, which results in increased contact resistance and therefore decreased conduction between the electrical contacts of the integrated circuit package and the mating electrical contacts of the mounting device. The insertion force used to place a leadless integrated circuit package into a mounting device typically removes some of this oxide, thereby providing improved electrical contact. However, leadless integrated circuit packages are typically not inserted into a mounting device in a manner that is conducive to the removal of oxide on the electrical contacts, and since leadless integrated circuit packages are not directly soldered to the mounting device, the accumulation of oxide on the electrical contacts can result in poor electrical contact.

Another problem that arises with the use of leadless integrated circuit packages is that the electrical contacts of a mounting device are typically electrically connected to electrical leads which are soldered directly to a circuit board. The mounting device must therefore be desoldered if replacement or removal is required. As is commonly known in the industry, repeated soldering and desoldering typically degrades the quality of a circuit board, usually to the point where replacement is required. Thus, a solderless electrical connection scheme would be desirable.

In the fabrication of electronic or electrical devices and circuits, conductive paths and contact areas are usually provided by chemical etching and photolithographic techniques such as in the fabrication of printed circuit boards, and by plating techniques whereby one or more metal layers are provided on, for example, electrical contacts or contact areas of circuit boards, electrical devices, and the like. Such fabrication techniques are well known and are widely employed. They do, however, require a number of process steps and specialized fabrication equipment which adds to the cost and complexity of the manufacturing process and of the resultant products. Thus, the discovery of simpler fabrication techniques would be desirable.

SUMMARY OF THE INVENTION

The present invention contemplates several types of electrically conductive elastomers and methods for producing the same. In one embodiment, the present invention is realized as a layered composition comprising: a substrate having an outer surface, wherein the substrate is formed of a non-conductive elastic material; a first layer that is grafted to the outer surface of the substrate, wherein the first layer is formed with a non-conductive elastic material; and a second layer that is grafted to the outer surface of the first layer, wherein the second layer is formed with a non-conductive elastic material having a quantity of conductive flakes interspersed therein. The second layer can further be formed with a quantity of rounded or jagged conductive particles interspersed in the non-conductive elastic material such that some of the conductive particles are present along an outer surface of the second layer. Alternatively, a quantity of rounded or jagged conductive particles may be imbedded in an outer surface of the second layer.

In another embodiment, the present invention is realized as an elastic conductive interconnect element which has an elongated shape and is formed with a non-conductive elastic material having a quantity of conductive flakes and a quantity of conductive powder granules interspersed therein. The elastic conductive interconnect element can further be formed with a quantity of rounded or jagged conductive particles interspersed in the non-conductive elastic material such that some of the conductive particles are present along an outer surface of said elastic conductive interconnect element.

In still another embodiment, the present invention is realized as an electrical interconnect comprising a non-conductive substrate having respective opposite surfaces and a plurality of apertures formed therein extending between the respective opposite surfaces; and a corresponding plurality of elastic conductive interconnect elements located within the plurality of apertures, wherein each elastic conductive interconnect element extends between the respective opposite surfaces of the substrate, and wherein each elastic conductive interconnect element is formed with a non-conductive elastic material having a quantity of conductive flakes and a quantity of conductive powder granules interspersed therein.

The present invention includes the methods for fabricating the above-mentioned embodiments, which are themselves unique due to some novel manufacturing processes.

In view of the foregoing, it is quite apparent how the present invention overcomes the shortcomings of the above-mentioned prior art devices.

Accordingly, the primary object of the present invention is to provide electrically conductive elastomers and methods for fabricating the same.

The above primary object, as well as other objects, features, and advantages, of the present invention will become readily apparent from the following detailed description which is to be read in conjunction with the appended drawings.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF THE INVENTION

Figure 1:
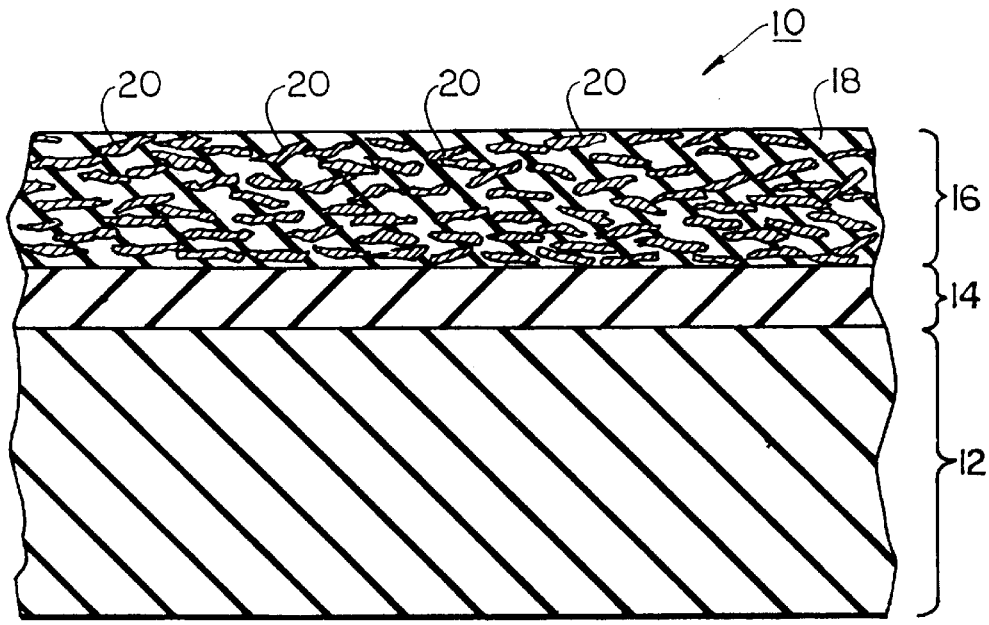
FIG. 1 is a cross-sectional view of a layered composition having an elastic conductive layer according to the present invention.

Referring to FIG. 1, there is shown a cross-sectional view of a layered composition 10 comprising an elastic substrate 12, an elastic primer layer 14, and an elastic conductive layer 16. The elastic substrate 12 may be fabricated of one of many elastic materials such as, for example, silicone rubber or flourosilicone rubber. The elastic primer layer 14 may also be fabricated of one of many elastic materials such as, for example, silicone rubber or flourosilicone rubber. The elastic conductive layer 16 comprises a mixture of an elastic material 18 and a quantity of conductive flakes 20. The elastic material 18 may further be fabricated of one of many elastic materials such as, for example, silicone rubber or flourosilicone rubber. The conductive flakes 20 may be fabricated of many different types of conductive or semiconductive materials such as, for example, silver, nickel, or carbon. Alternatively, the conductive flakes 20 may be fabricated of many different types of conductive, semiconductive, or insulative materials which are coated with or have interspersed therein other conductive or semiconductive materials such as, for example, silver, nickel, or carbon. The size of the conductive flakes may vary depending on the level of conductivity that is required.

The layered composition 10 may be fabricated by a thermal grafting process which typically begins by providing the elastic substrate 12 in a fully cured state. The elastic primer layer 14 is then deposited on the elastic substrate 12 by spray coating or any other known means. The elastic conductive layer 16 is then deposited on the elastic primer layer 14 also by spray coating or any other known means. The entire layered structure is then subjected to a thermal cycle whereby the elastic primer layer 14 is fully cured and grafted to the elastic substrate 12, and the elastic conductive layer 16 is fully cured and grafted to the elastic primer layer 14. During this thermal grafting process, polymer chains in the elastic primer layer 14 are grafted to polymer chains in the elastic substrate 12 so as to form a strong bond. Likewise, polymer chains in the elastic conductive layer 16 are grafted to polymer chains in the elastic primer layer 14 so as to form a strong bond. This thermal grafting process eliminates the need to etch or otherwise pretreat the surface of the elastic substrate 12.

There is generally no limitation on the thickness of the elastic substrate 12. A typical thickness of the combination of the elastic primer layer 14 and the elastic conductive layer 16 is in the range of 0.5 to 10 mil. Generally, the elastic conductive layer 16 is two times as thick as the elastic primer layer 14. The durometer rating of all of the elastic materials typically ranges between 40 and 80 on the Shore A scale. The resistance of an elastic conductive layer 16 having all of the above-stated characteristics has been shown to be in the range of 20–30 mohm during measurements performed by compressively mating the surface of the elastic conductive layer 16 with a Sn/Pb trace on a printed circuit board.

The conductive flakes 20 which are suspended within the elastic material 18 of the elastic conductive layer 16 provide low resistivity even when the elastic conductive layer 16 is being deformed through expansion or compression since the surface area of the conductive flakes 20 is large enough for electrical contact to be made between adjacent conductive flakes 20 when such deformities occur. For instance, during lengthwise expansion of the elastic conductive layer 16, the length of the elastic conductive layer 16 is increased while the thickness of the elastic conductive layer 16 is decreased. The decrease in thickness brings adjacent conductive flakes 20 closer together, thereby increasing the likelihood that the large surface areas of adjacent conductive flakes 20 will come into physical, and hence electrical, contact with each other. The increase in length results in lateral movement of the conductive flakes 20, thereby causing the large surface areas of adjacent conductive flakes 20 to rub or scrape against each other so that physical, and hence electrical, contact between adjacent conductive flakes 20 is maintained.

One particular application wherein the above-described layered composition 10 would be useful is a telephone or calculator keypad wherein an electrical connection must be made by pressing a key on the keypad. If such a keypad were constructed with an elastic material such as, for example, silicone rubber or flourosilicone rubber, an elastic conductive layer could be grafted onto a surface of that elastic material according to the process described above. Thus, when a key of the keypad is pressed against a mating conductive device, such as a conductive trace on a printed circuit board, an electrical connection would be made between the elastic conductive layer and the conductive trace.

Figure 2:
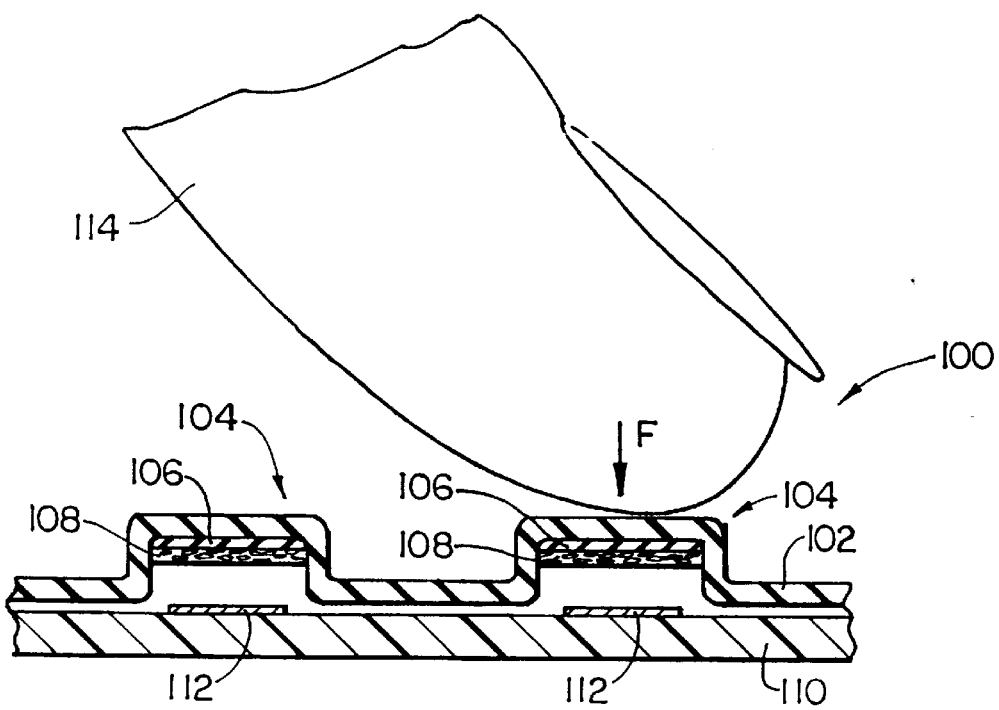
FIG. 2 is a cross-sectional view of a telephone or calculator keypad having an elastic conductive layer according to the present invention.

Referring to FIG. 2, there is shown a cross-sectional view of a telephone or calculator keypad 100 comprising an elastic cover 102 having keys 104 formed therein. On the underside of the cover 102, beneath each of the keys 104, an elastic primer layer 106 is grafted to the elastic cover 102 and an elastic conductive layer 108 is grafted to the elastic primer layer 106.

A printed circuit board 110 is positioned beneath the entire cover 102, and conductive traces 112 are formed on the printed circuit board 110 beneath the keys 104. Thus, when a force F is applied to one of the keys 104 of the elastic cover 102 from, for example, a human finger 114, the elastic conductive layer 108 will come into electrical contact with a corresponding one of the conductive traces 112.

Figure 3:
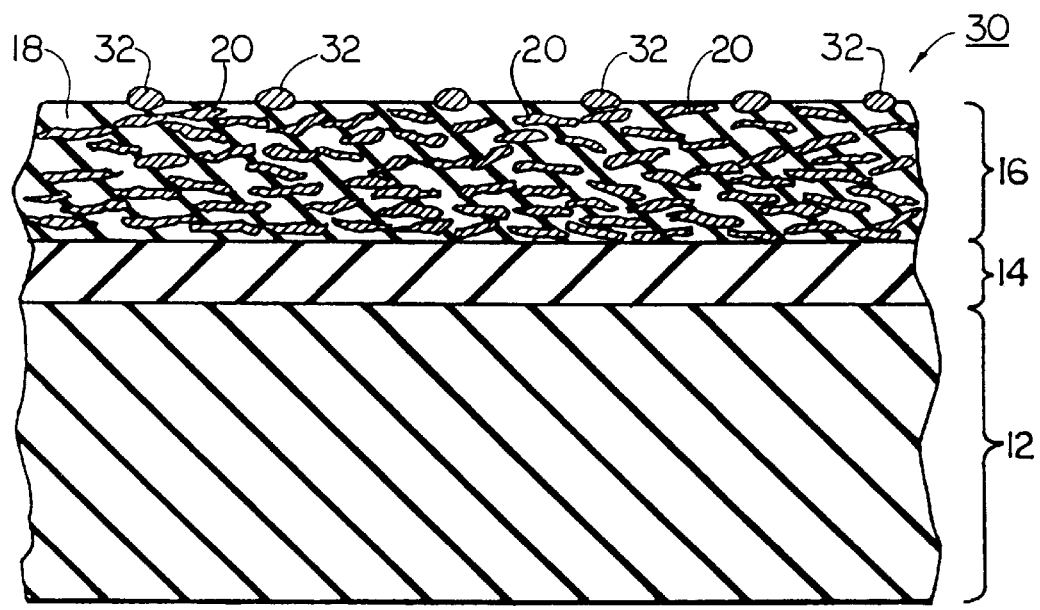
FIG. 3 is a cross-sectional view of a layered composition having an elastic conductive layer and indenting particles according to the present invention.

Referring to FIG. 3, there is shown a cross-sectional view of a layered composition 30 similar to the layered composition 10 described in FIG. 1, but with conductive indenting particles 32 imbedded into the surface of the elastic conductive layer 16. The conductive indenting particles 32 are applied to the surface of the elastic conductive layer 16 prior to the thermal cycle so that the particles 32 are secured to the elastic conductive layer 16 when it fully cures. The indenting nature of the conductive indenting particles 32 provides a means by which an insulating oxide which may have formed on a conductive surface which is to mate with the elastic conductive layer 16 may be pushed aside so that an improved electrical connection may be formed between that conductive surface and the elastic conductive layer 16. It should be noted that the conductive indenting particles 32 may push aside other contaminants such as fibers and particulates which may be present on a mating conductive surface.

The conductive indenting particles 32 may be fabricated of many different types of conductive or semiconductive materials such as, for example, silver, nickel, or carbon. Alternatively, the conductive indenting particles 32 may be fabricated of many different types of conductive, semiconductive, or insulative materials which are coated with or have interspersed therein other conductive or semiconductive materials such as, for example, silver, nickel, or carbon. The conductive indenting particles 32 typically have a 50 $\mu$m average particle size.

Figure 4:
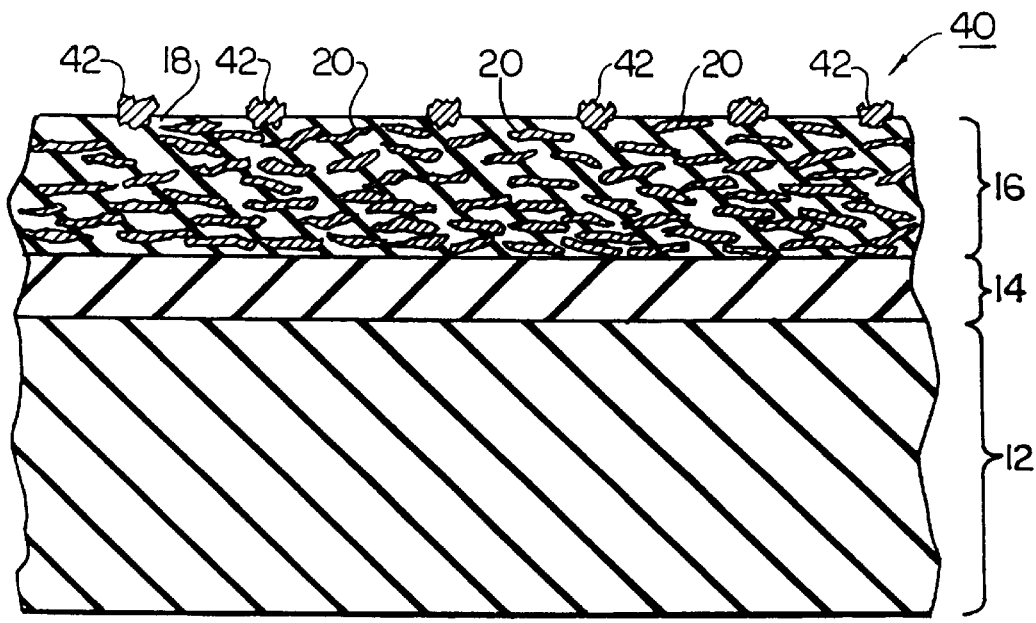
FIG. 4 is a cross-sectional view of a layered composition having an elastic conductive layer and piercing particles according to the present invention.

Referring to FIG. 4, there is shown a cross-sectional view of a layered composition 40 similar to the layered composition 10 described in FIG. 1, but with conductive piercing particles 42 imbedded into the surface of the elastic conductive layer 16. The conductive piercing particles 42 are applied to the surface of the elastic conductive layer 16 prior to the thermal cycle so that the particles 42 are secured to the elastic conductive layer 16 when it fully cures. The piercing nature of the conductive piercing particles 42 provides a means by which an insulating oxide which may have formed on a conductive surface which is to mate with the elastic conductive layer 16 may be pierced so that an improved electrical connection may be formed between that conductive surface and the elastic conductive layer 16. It should be noted that the conductive piercing particles 42 may pierce through other contaminants such as fibers and particulates which may be present on a mating conductive surface.

Similar to the conductive indenting particles 32, the conductive piercing particles 42 may be fabricated of many different types of conductive or semiconductive materials such as, for example, silver, nickel, or carbon. Alternatively, the conductive piercing particles 42 may be fabricated of many different types of conductive, semiconductive, or insulative materials which are coated with or have interspersed therein other conductive or semiconductive materials such as, for example, silver, nickel, or carbon. The conductive piercing particles 42 typically have a 40 $\mu$m average particle size.

Figure 5:
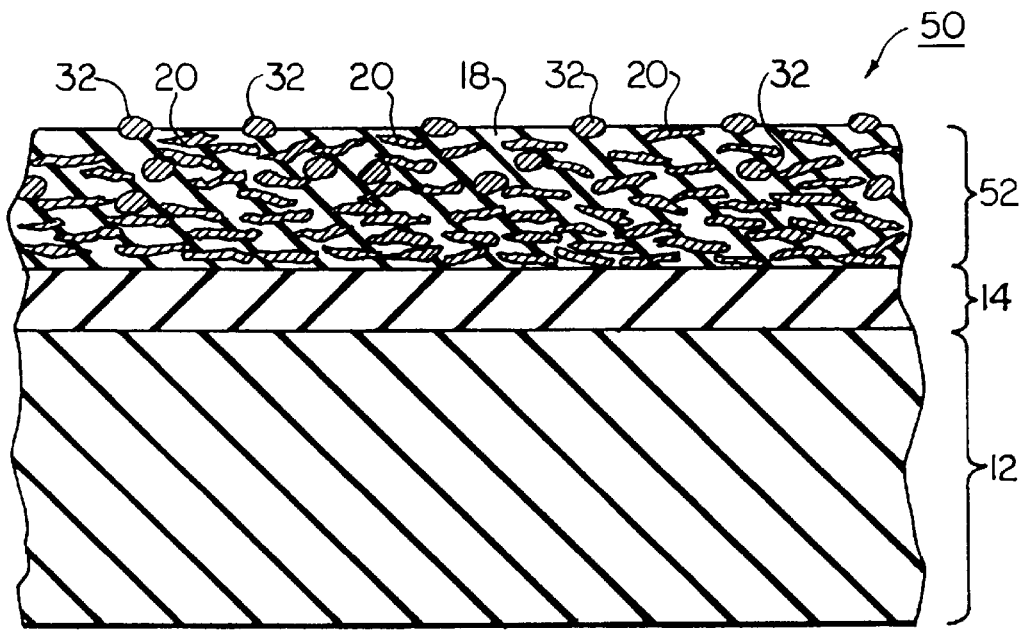
FIG. 5 is a cross-sectional view of a layered composition having an elastic conductive layer with indenting particles according to the present invention.

Referring to FIG. 5, there is shown a cross-sectional view of a layered composition 50 similar to the layered composition 10 described in FIG. 1, but with an elastic conductive layer 52 comprising a mixture of the elastic material 18, a quantity of the conductive flakes 20, and a quantity of the conductive indenting particles 32. In the fabrication of this layered composition 50, the conductive indenting particles 32 are deposited on the elastic primer layer 14 along with the elastic material 18 and the conductive flakes 20. The distribution of the conductive indenting particles 32 in the elastic conductive layer 52 is shown to be near the surface of the elastic conductive layer 52 since the conductive indenting particles 32 are more likely than the conductive flakes 20 to bounce off the elastic primer layer 14 during the application of the elastic conductive layer 52. Of course, this location for the conductive indenting particles 32 is preferable based on their functionality (e.g., to push aside oxide on a mating conductive surface). The amount of the conductive indenting particles 32 in the elastic conductive layer 52 need typically only be 5% nominal by weight in order to insure their proper functionality.

Figure 6:
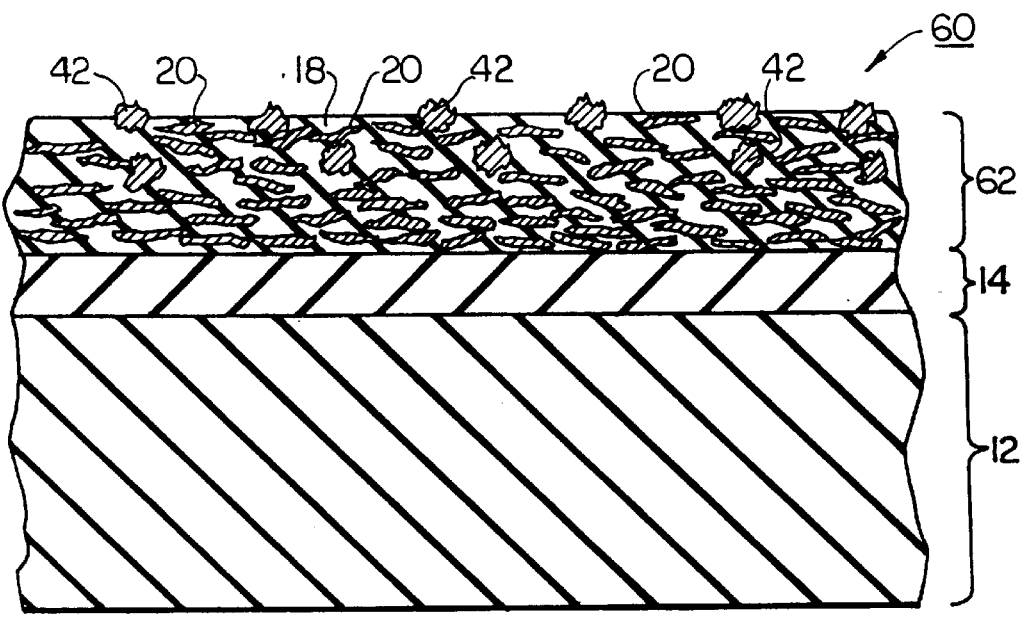
FIG. 6 is a cross-sectional view of a layered composition having an elastic conductive layer with piercing particles according to the present invention.

Referring to FIG. 6, there is shown a cross-sectional view of a layered composition 60 similar to the layered composition 10 described in FIG. 1, but with an elastic conductive layer 62 comprising a mixture of the elastic material 18, a quantity of the conductive flakes 20, and a quantity of the conductive piercing particles 42. In the fabrication of this layered composition 50, the conductive piercing particles 42 are deposited on the elastic primer layer 14 along with the elastic material 18 and the conductive flakes 20. The distribution of the conductive piercing particles 42 in the elastic conductive layer 62 is shown to be near the surface of the elastic conductive layer 62 since the conductive piercing particles 42 are more likely than the conductive flakes 20 to bounce off the elastic primer layer 14 during the application of the elastic conductive layer 62. Of course, this location for the conductive piercing particles 42 is preferable based on their functionality (e.g., to pierce through oxide on a mating conductive surface). The amount of the conductive piercing particles 42 in the elastic conductive layer 62 need typically only be 5% nominal by weight in order to insure their proper functionality.

At this point it should be noted that the elastic substrate 12 in all of the above-described layered compositions 10, 30, 40, 50, and 60 may be replaced with a material that is merely flexible such as, for example, the thermal plastics polyimide (known by the trade name capton™) or polyamide (known by the trade name nylon™). The elastic primer layer 14 would be grafted to such a flexible substrate in the manner described above, along with the grafting of the elastic conductive layer 16 to the elastic primer layer 14.

One particular application wherein a layered composition that is similar to one of the above-described layered compositions 10, 30, 40, 50, and 60, except having a flexible substrate, would be useful is a pushbutton switch wherein an electrical connection must be made by pressing a button of the switch. If the button of such a switch were constructed with a flexible material such as, for example, polyimide or polyamide thermal plastic, an elastic conductive layer could be grafted onto a surface of that elastic material according to the process described above. Thus, when the button of such a switch is pressed against a mating conductive device, such as metal contacts, an electrical connection would be made between the elastic conductive layer and the metal contacts.

Figure 7:
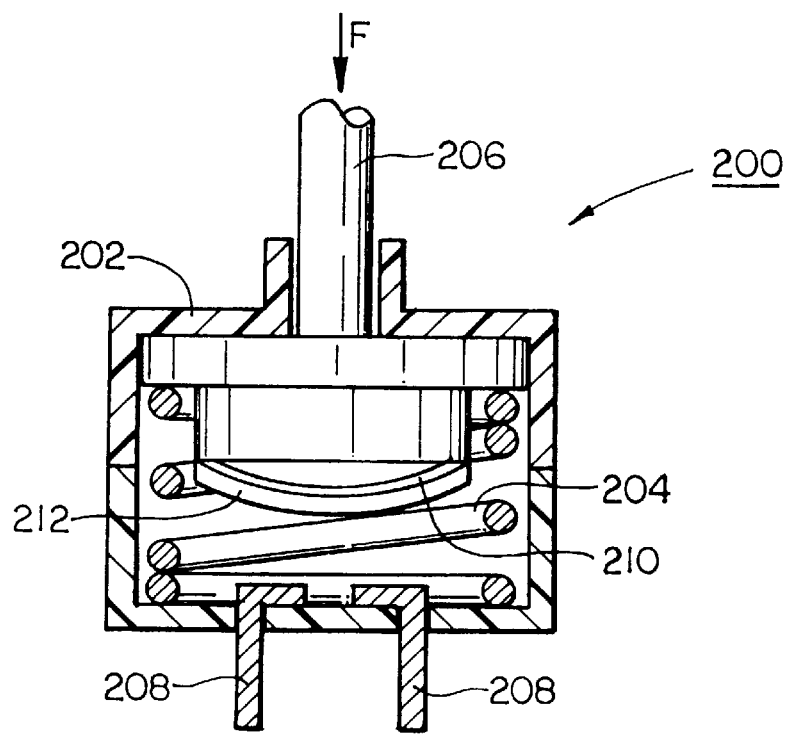
FIG. 7 is a cross-sectional view of a pushbutton switch having an elastic conductive layer according to the present invention.

Referring to FIG. 7, there is shown a cross-sectional view of a pushbutton switch 200 comprising a housing 202 for containing a recoil spring 204 and a button actuator 206. The housing 202 provides metal contacts 208 with access to the interior thereof.

The button actuator 206 is fabricated of a flexible thermal plastic material such as, for example, polyimide or polyamide. An elastic primer layer 210 is grafted to a bottom contact surface of the button actuator 206, and an elastic conductive layer 212 is grafted to the elastic primer layer 210. When a force F is applied to the button actuator 206, the elastic conductive layer 212 will come into electrical contact with the metal contacts 208, thereby closing the switch 200.

At this point it should be noted that any of the above-described layered compositions 10, 30, 40, 50, and 60 may be utilized with the telephone or calculator keypad 100 of FIG. 2 or the pushbutton switch 200 of FIG. 7, or with any number of other devices wherein the use of an elastic conductive layer would be useful.

It should also be noted that the elastic conductive layers 16, 52, 62, 108, and 212 employed in all of the above-described layered compositions 10, 30, 40, 50, and 60 are useful for providing shielding from electric and magnetic fields, or for providing a conductive plane for grounding purposes or the like. More particularly, the density and grouping of the conductive flakes 20 in the above-described elastic conductive layers 16, 52, 62, 108, and 212 are such that extremely effective shielding or grounding layers may be provided. The above-described elastic conductive layers 16, 52, 62, 108, and 212 may also be used to form electrical connections with conductive traces on printed circuit boards simply by forcing the elastic conductive layers 16, 52, 62, 108, and 212 against the conductive traces.

Figure 8:
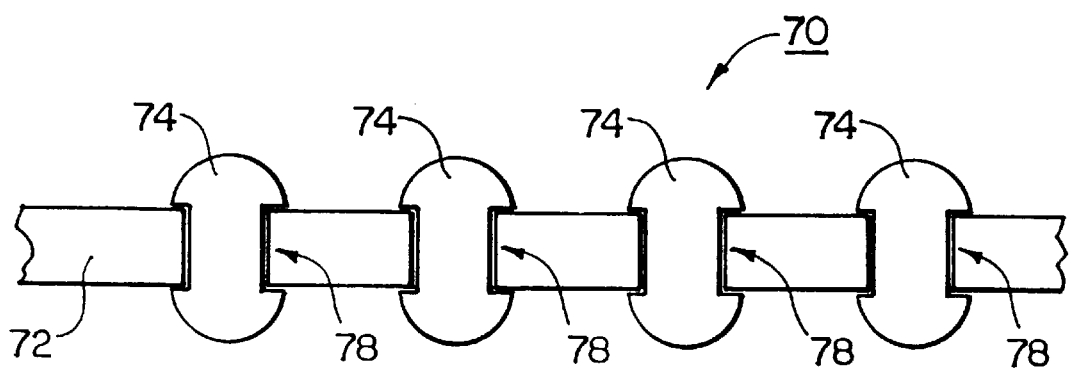
FIG. 8 is a cross-sectional view of an interconnect device having elastic conductive interconnect elements according to the present invention.

Referring to FIG. 8, there is shown a cross-sectional view of an interconnect device 70 comprising an insulating substrate 72 having an array of openings 78 formed therein. An elastic conductive interconnect element 74 is situated within each opening 78. Such an interconnect device 70 may be used, for example, to provide electrical connections between electrical contacts on a leadless integrated circuit package and electrical contacts on a printed circuit board. Such electrical contacts may be of the ball or the land grid array variety.

Figure 9:
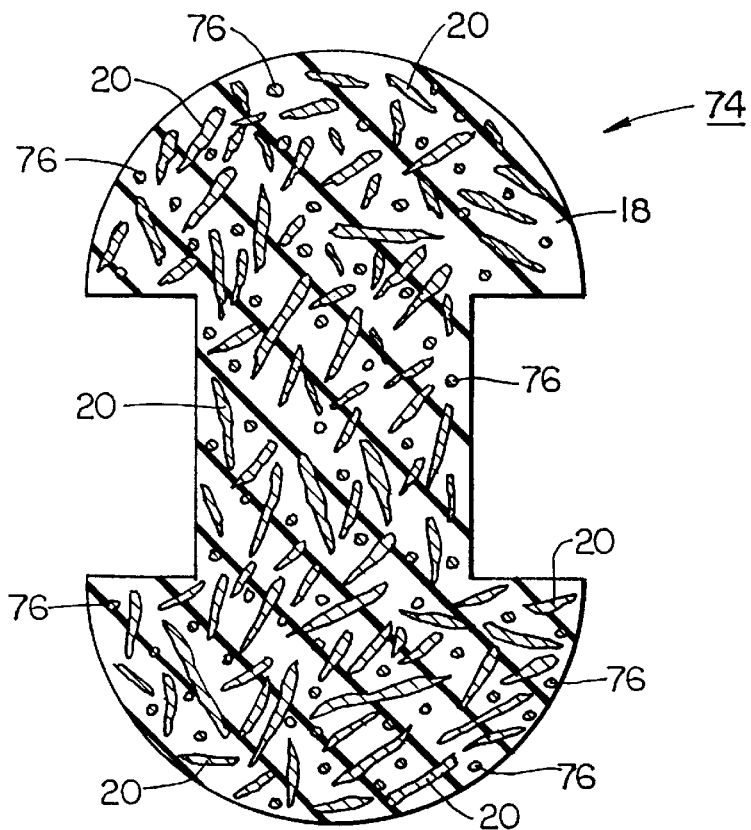
FIG. 9 is a cross-sectional view of one of the elastic conductive interconnect elements shown in FIG. 8.

Referring to FIG. 9, there is shown a cross-sectional view of one of the elastic conductive interconnect elements 74. The elastic conductive interconnect element 74 comprises a mixture of the elastic material 18, a quantity of the conductive flakes 20, and a quantity of conductive powder granules 76. The conductive powder granules 76 may be fabricated of many different types of conductive or semiconductive materials such as, for example, silver, nickel, or carbon. The size of the conductive powder granules 76 may vary depending on the level of conductivity that is required.

The conductive powder granules 76 provide conductive bridges between the conductive flakes 20, thereby increasing the conductivity of the elastic conductive interconnect element 74. The amount of the conductive powder granules 76 that must be added to the mixture of the elastic material 18 and the conductive flakes 20 to provide such an increase in conductivity may vary depending on the level of conductivity that is required.

Figure 10:
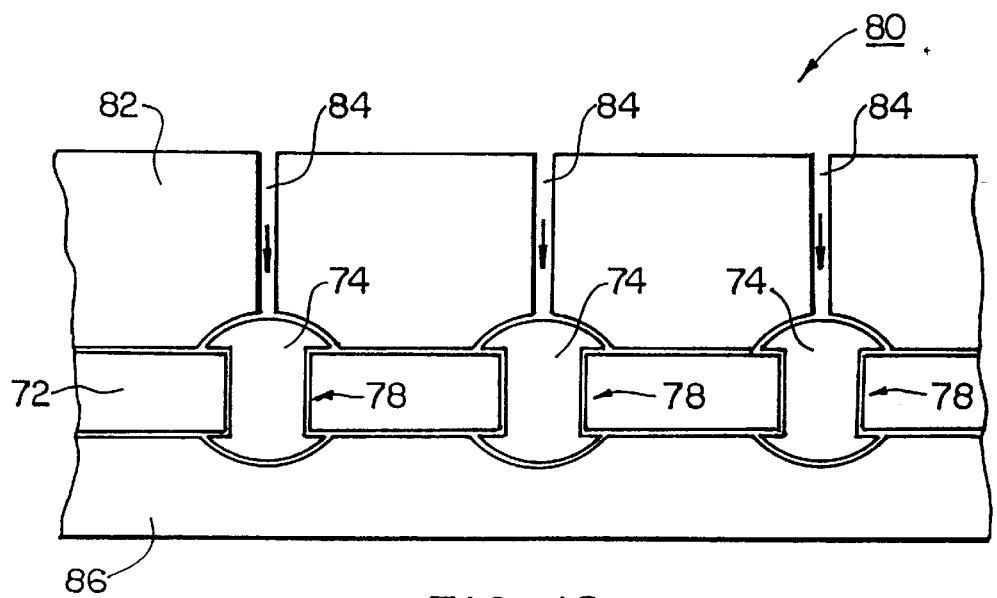
FIG. 10 is a cross-sectional view of an injection apparatus for forming elastic conductive interconnect elements according to the present invention.

Referring to FIG. 10, there is shown a cross-sectional view of an injection apparatus 80 for forming the elastic conductive interconnect elements 74 in the openings 78 of the insulating substrate 72. The apparatus 80 comprises an upper mold section 82 having injection vias 84 formed therein, and a lower mold section 86. The mixture of the elastic material 18, the conductive flakes 20, and the conductive powder granules 76 flows down through the vias 84 and fills the empty voids formed between the upper 82 and lower 86 mold sections and the openings 78 in the insulating substrate 72. The mixture is initially heated, but it is later cooled so as to allow it to cure. The cooling results in an expansion of the mixture so that the elastic conductive interconnect elements 74 are securely positioned in the openings 78. It should be noted that the shape of the upper 82 and lower 86 mold sections in the areas of the interconnect elements may vary according to the particular application of the interconnect elements (e.g., interconnecting land grid array contacts or interconnecting ball gird array contacts).

Figure 11:
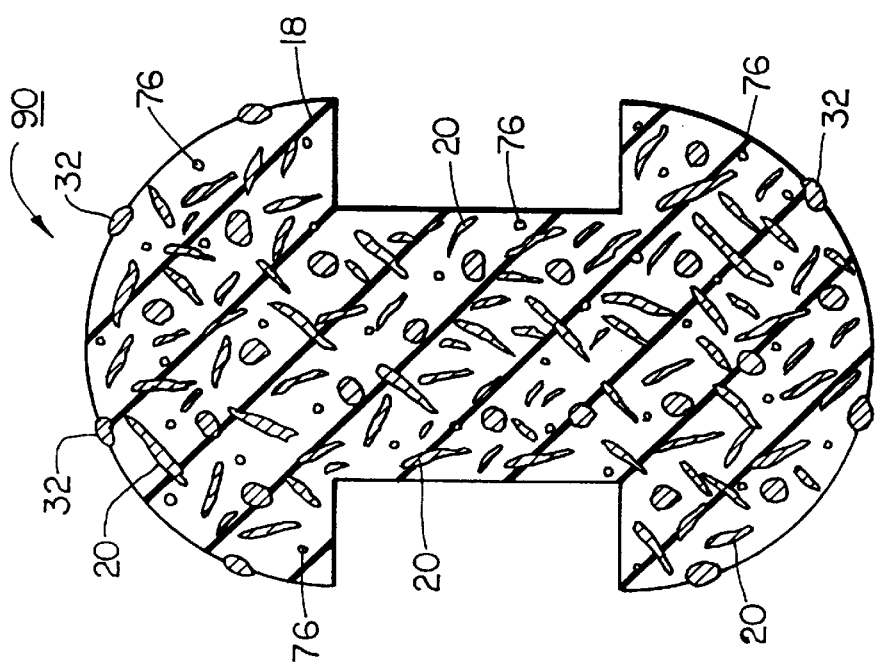
FIG. 11 is a cross-sectional view of an elastic conductive interconnect element having conductive indenting particles according to the present invention.

Referring to FIG. 11, there is shown a cross-sectional view of an elastic conductive interconnect element 90 similar to the elastic conductive interconnect element 74 shown in FIG. 9, but with a quantity of the conductive indenting particles 32 added to the mixture of the elastic material 18, the conductive flakes 20, and the conductive powder granules 76. Similar to the elastic conductive layer 52 described above in FIG. 5, the amount of the conductive indenting particles 32 in the elastic conductive interconnect element 90 need typically only be 5% nominal by weight in order to insure their proper functionality. It should be noted that the conductive indenting particles 32 may instead be added to just the surface of an elastic conductive interconnect element after the element has been formed but before it fully cures.

Figure 12:
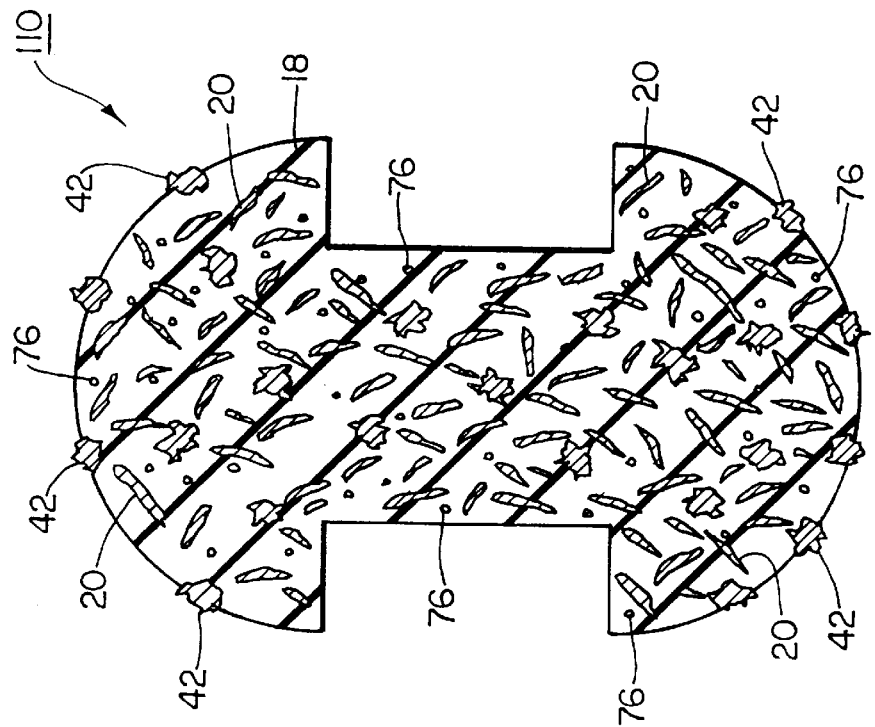
FIG. 12 is a cross-sectional view of an elastic conductive interconnect element having conductive piercing particles according to the present invention.

Referring to FIG. 12, there is shown a cross-sectional view of an elastic conductive interconnect element 110 similar to the elastic conductive interconnect element 74 shown in FIG. 9, but with a quantity of the conductive piercing particles 42 added to the mixture of the elastic material 18, the conductive flakes 20, and the conductive powder granules 76. Similar to the elastic conductive layer 62 described above in FIG. 6, the amount of the conductive piercing particles 42 in the elastic conductive interconnect element 90 need typically only be 5% nominal by weight in order to insure their proper functionality. It should be noted that the conductive piercing particles 42 may instead be added to just the surface of an elastic conductive interconnect element after the element has been formed but before it fully cures.

The present invention is not to be limited in scope by the specific embodiments described herein. Indeed, various modifications of the present invention, in addition to those described herein, will be apparent to those of skill in the art from the foregoing description and accompanying drawings. Thus, such modifications are intended to fall within the scope of the appended claims.

What is claimed is:

1. A layered composition comprising:

a substrate, said substrate having an outer surface, said substrate being formed of a non-conductive elastically resilient material;

a first layer having a first surface and a second surface, the first surface thermally grafted directly to at least a portion of said outer surface of said substrate, said first layer being formed of a non-conductive elastically resilient material; and a second layer having a first surface and a second surface, said first surface thermally grafted directly to at least a portion of said second surface of said first layer, said second layer being formed of a non-conductive elastically resilient material having a quantity of conductive flakes interspersed therein.

2. The layered composition as defined in claim 1, wherein the thermal grafting of said first layer and said second layer is performed by a single process.

3. The layered composition as defined in claim 1, wherein said conductive flakes are formed of a solid conductive material.

4. The layered composition as defined in claim 1, wherein said conductive flakes are formed of a semiconductive material that is coated with a conductive material.

5. The layered composition as defined in claim 1, wherein said conductive flakes are formed of a non-conductive material that is coated with a conductive material.

* * * * *